United States Patent
Kim et al.

(10) Patent No.: US 11,369,051 B2
(45) Date of Patent: Jun. 21, 2022

(54) ELECTROMAGNETIC INTERFERENCE (EMI) SHIELDING MEMBER AND ELECTRONIC DEVICE INCLUDING THE SAME

(71) Applicant: Samsung Electronics Co., Ltd., Suwon-si (KR)

(72) Inventors: Junghwan Kim, Suwon-si (KR); Jaedeok Lim, Suwon-si (KR); Hyein Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/880,196

(22) Filed: May 21, 2020

(65) Prior Publication Data

US 2021/0029853 A1    Jan. 28, 2021

(30) Foreign Application Priority Data

Jul. 26, 2019   (KR) .................. 10-2019-0091270

(51) Int. Cl.
*H05K 9/00* (2006.01)
*H05K 1/18* (2006.01)
*H05K 1/02* (2006.01)

(52) U.S. Cl.
CPC ........... *H05K 9/009* (2013.01); *H05K 1/0216* (2013.01); *H05K 1/181* (2013.01); *H05K 2201/093* (2013.01)

(58) Field of Classification Search
CPC .......... H05K 9/00; H05K 9/04; H05K 9/0088; H05K 9/009; H05K 1/02; H05K 1/18; H05K 1/181–188; H01L 23/552; H01L 23/31; H01L 23/498; B32B 5/02; B32B 5/26; B32B 7/12; B32B 27/12; B32B 27/36
USPC .......... 361/816, 818; 257/659–690; 174/350, 174/520
See application file for complete search history.

(56) References Cited

U.S. PATENT DOCUMENTS

| | | | |
|---|---|---|---|
| 9,484,313 B2 * | 11/2016 | Chung | ..................... H01L 24/97 |
| 10,602,603 B2 | 3/2020 | Zhang et al. | |
| 10,652,996 B2 * | 5/2020 | Chiu | .................... H05K 1/0216 |
| 10,798,849 B2 | 10/2020 | Lee et al. | |
| 2010/0294559 A1 * | 11/2010 | Izawa | .................. H05K 9/0024 156/60 |

(Continued)

FOREIGN PATENT DOCUMENTS

| | | |
|---|---|---|
| JP | 2005-064266 A | 3/2005 |
| KR | 10-2016-0104918 A | 9/2016 |

(Continued)

OTHER PUBLICATIONS

International Search Report dated Nov. 2, 2020, issued in International Application No. PCT/KR2020/009584.

*Primary Examiner* — Tuan T Dinh
(74) *Attorney, Agent, or Firm* — Jefferson IP Law, LLP

(57) ABSTRACT

A shielding member is provided. The shielding member includes a shielding layer having flexibility, and an insulating layer stacked on the shielding layer. The shielding layer includes a nanofiber layer including nanofibers plated to have electrical conductivity and coated with an adhesive material, and conductive particles disposed in the nanofiber layer.

16 Claims, 7 Drawing Sheets

(56) References Cited

U.S. PATENT DOCUMENTS

| | | | |
|---|---|---|---|
| 2013/0082367 A1* | 4/2013 | Yoo | H05K 9/0024 |
| | | | 438/584 |
| 2014/0251662 A1* | 9/2014 | Rotto | H05K 1/0274 |
| | | | 174/253 |
| 2015/0342099 A1* | 11/2015 | Jang | B32B 15/04 |
| | | | 174/350 |
| 2016/0007510 A1* | 1/2016 | Cheng | H05K 9/0088 |
| | | | 428/551 |
| 2016/0249731 A1 | 9/2016 | Jo et al. | |
| 2017/0033086 A1* | 2/2017 | Homma | H01L 23/3107 |
| 2017/0181266 A1 | 6/2017 | Hunt et al. | |
| 2018/0299708 A1* | 10/2018 | Liang | G02F 1/13306 |
| 2019/0143636 A1* | 5/2019 | Seo | C09J 7/38 |
| | | | 361/760 |
| 2020/0396871 A1 | 12/2020 | Yun et al. | |

FOREIGN PATENT DOCUMENTS

| | | | |
|---|---|---|---|
| KR | 10-2017-0097541 A | 8/2017 | |
| KR | 10-2019-0019874 A | 2/2019 | |
| KR | 10-2019-0053589 A | 5/2019 | |
| KR | 10-2019-0060180 A | 6/2019 | |
| WO | 2016/192069 A1 | 12/2016 | |

\* cited by examiner

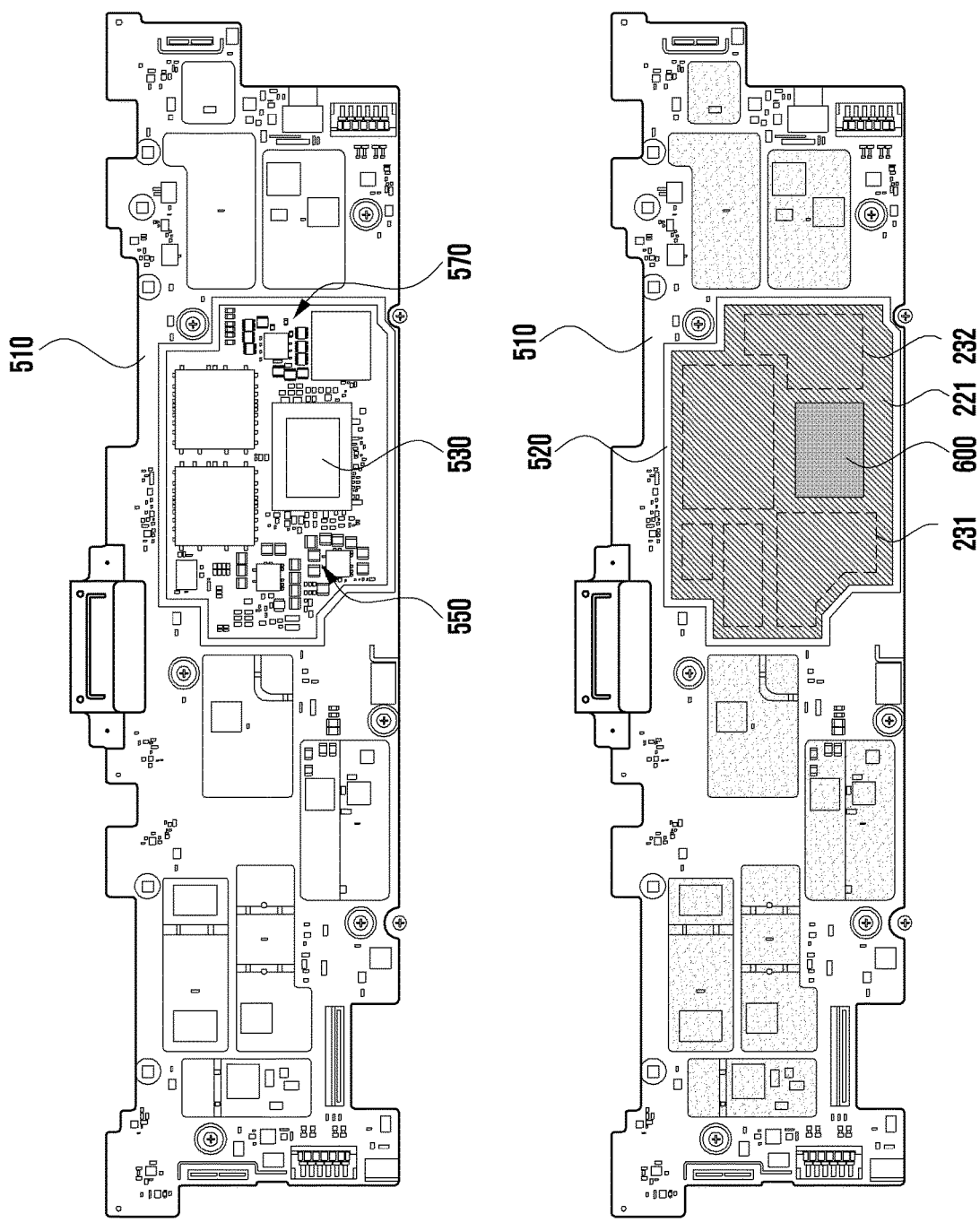

ELECTROMAGNETIC INTERFERENCE (EMI) SHIELDING MEMBER AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2019-0091270, filed on Jul. 26, 2019, in the Korean Intellectual Property Office, the disclosure of which is incorporated by reference herein in its entirety.

BACKGROUND

1. Field

The disclosure relates to a shielding member performing an electromagnetic interference (EMI) shielding function and an electronic device including the same.

2. Description of Related Art

Electronic devices, such as a smart phone, a tablet personal computer (PC), and a laptop computer are becoming smaller, slimmer, and multifunctional. In addition, various kinds of electronic components used in such electronic devices are becoming highly integrated and having an increased speed of signal processing.

When the electronic components perform signal processing, unwanted noise in the form of electromagnetic waves is generated. In the highly integrated electronic components, such noise is one of the causes of malfunction or inefficient operation of adjacent electronic components.

EMI shielding is a technique that can block noise generated by electronic components from being transferred to the outside, thereby ensuring normal operations of the electronic components and also protecting the electronic components. For example, using the EMI shielding technique can prevent noise generated in an integrated circuit (IC) chip from being induced to other electronic components (e.g., other IC chip, an antenna) or electrical wiring.

In the EMI shielding technique, one of factors influencing the shielding performance is the value of a contact resistance between an EMI shielding member and a ground portion. Normally, the less the contact resistance, the better the shielding performance.

An EMI shielding member of the related art includes a conductive layer formed of metal and a conductive adhesive layer formed for fixing the shielding member. A contact portion is formed between the conductive layer and the conductive adhesive layer. This structure of the shielding member of the related art has a problem of high contact resistance.

In addition, it has been reported that the conductive layer formed of metal has a problem of poor shielding performance due to internal cracks thereof caused by an external force, or deformation of a contact structure of the contact portion.

Further, because the conductive adhesive layer has low thermal conductivity, it may cause a reduction in heat dissipation of electronic components surrounded by the shielding member.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electromagnetic interference (EMI) shielding member and an electronic device including the same.

Additional aspects will be set forth in part in the description which follows and, in part, will be apparent from the description, or may be learned by practice of the presented embodiments.

In accordance with an aspect of the disclosure, a shielding member is provided. The shielding member includes a shielding layer having flexibility and an insulating layer stacked on the shielding layer. The shielding layer may include a nanofiber layer including nanofibers plated to have electrical conductivity and coated with an adhesive material, and conductive particles disposed in the nanofiber layer.

In accordance with another aspect of the disclosure, an electronic device is provided. The electronic device includes a printed circuit board (PCB) on which various electronic components are mounted, a ground portion disposed on the PCB, and a shielding member disposed to cover the electronic components and the ground portion. The shielding member may include a shielding layer having nanofibers and corresponding to only one contact portion in electrical contact with the ground portion.

According to various embodiments of the disclosure, it is possible to improve EMI shielding performance of the shielding member. In addition, the shielding member may have high shielding reliability by being formed of a material having a high elastic modulus. Further, the shielding member may effectively transfer heat of electronic components.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description, taken in conjunction with the accompanying drawings, in which:

FIG. 5A is a plan view of a printed circuit board of an electronic device, to which a shielding member is applied, according to an embodiment of the disclosure;

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment.

The same reference numbers are used throughout the drawings to refer to the same or like parts. As used herein, the singular forms are intended to include the plural forms as well, unless the context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

Figure 1:
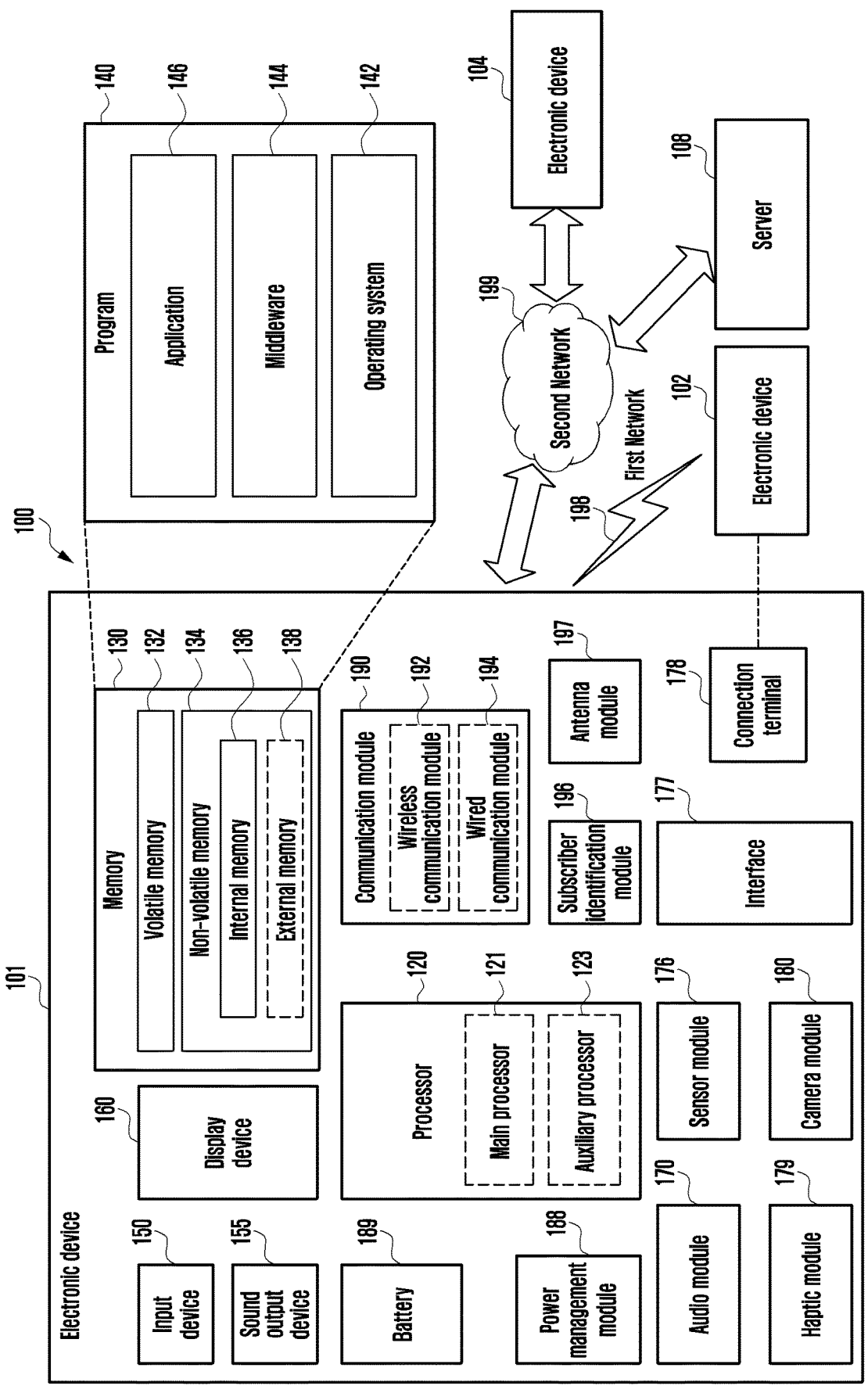
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments of the disclosure, at least one (e.g., the display device 160 or the camera module 180) of the components may be omitted from the electronic device 101, or one or more other components may be added in the electronic device 101. In some embodiments of the disclosure, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134 (including an internal memory 1336 and an external memory 138). According to an embodiment of the disclosure, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment of the disclosure, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment of the disclosure, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment of the disclosure, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to an embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment of the disclosure, the antenna module 197 may include an antenna including a radiating element composed of a conductive material or a conductive pattern formed in or on a substrate (e.g., PCB). According to an embodiment of the disclosure, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
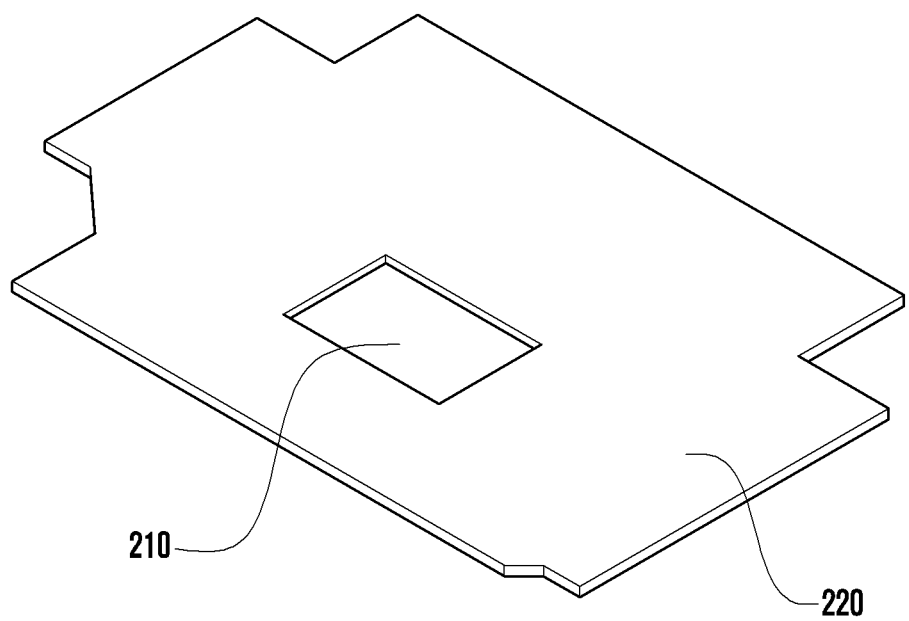
FIG. 2 is a perspective view of a shielding member according to an embodiment of the disclosure.

FIG. 2 is a perspective view of a shielding member according to an embodiment of the disclosure.

Figure 3:
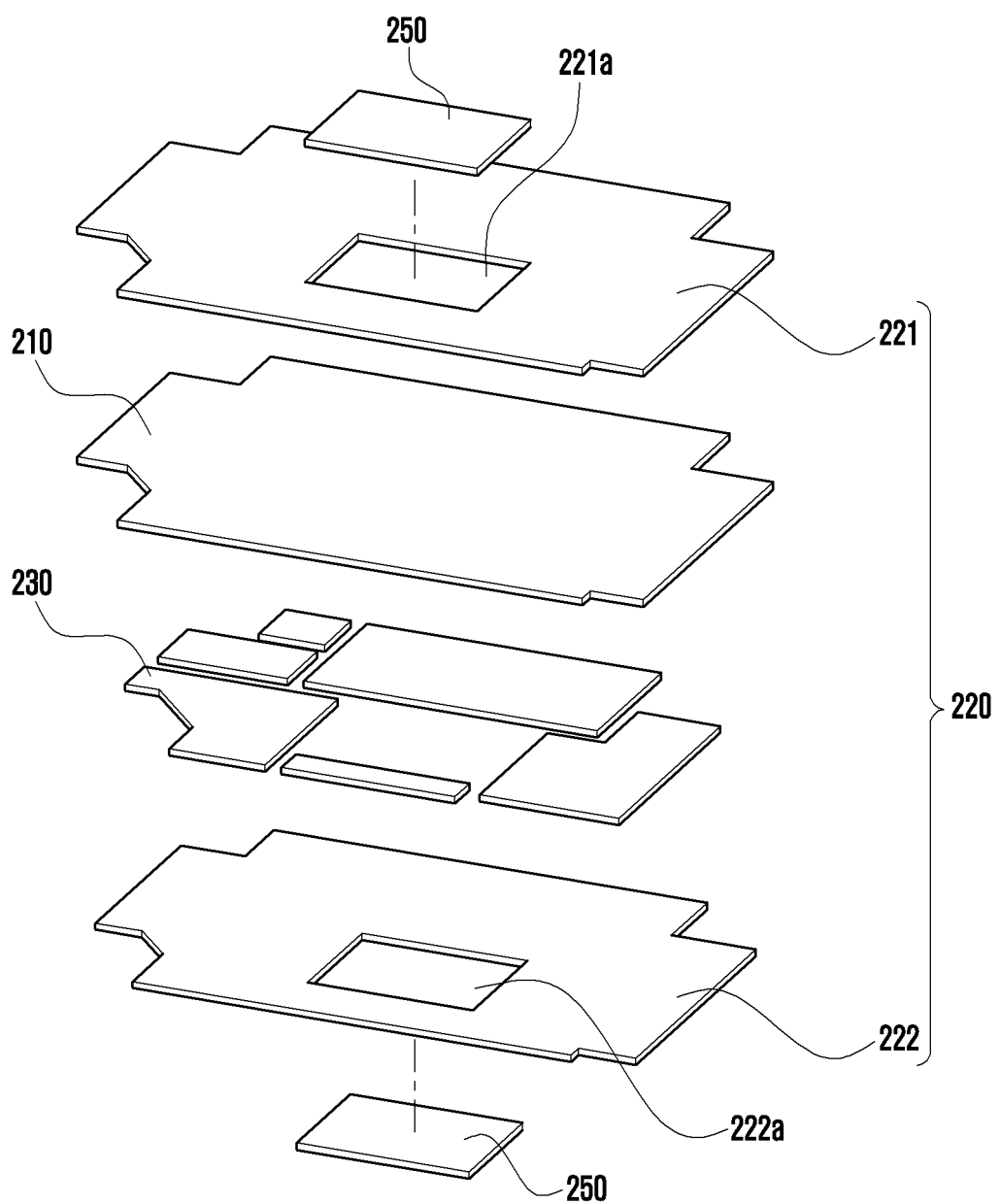
FIG. 3 is an exploded perspective view of a shielding member according to an embodiment of the disclosure.

FIG. 3 is an exploded perspective view of a shielding member according to an embodiment of the disclosure.

Figure 4:
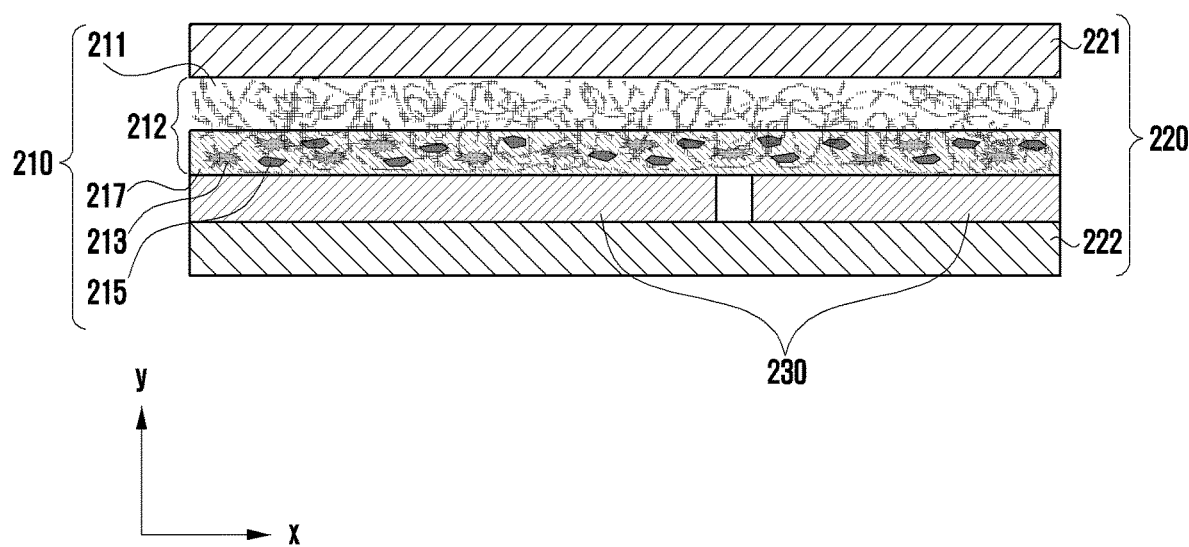
FIG. 4 is a cross-sectional view of a shielding member according to an embodiment of the disclosure.

FIG. 4 is a cross-sectional view of a shielding member according to an embodiment of the disclosure.

Referring to FIG. 4, the thicknesses of a shielding layer 210, an insulating layer 220, and an absorbing layer 230 are arbitrarily illustrated for convenience of explanation, and their actual thicknesses may be varied. In addition, a nanofiber layer 212 in FIG. 4 is exaggeratedly illustrated to represent a nanofiber 211. The shapes and sizes of a metal particle 215 and a graphite particle 213 are also exaggerated for explanation.

Referring to FIG. 2, the shielding member according to various embodiments of the disclosure may be manufactured in the form of a laminated film. The shielding member may be disposed to cover various electronic components mounted on a printed circuit board (PCB) (e.g., a PCB 510 in FIG. 5A). The shape of the shielding member shown in FIGS. 2 and 3 may be changed according to the arrangement of electronic components on the PCB.

The shielding member may include the shielding layer 210, the insulating layer 220, and the absorbing layer 230.

The shielding layer 210 may shield noise so that the noise generated from various electronic components mounted on the PCB does not leak out of the shielding member. The shielding layer 210 may include the nanofiber layer 212 and conductive particles. The conductive particles may include at least one of the metal particles 215 and the graphite particles 213.

The nanofiber layer 212 of the shielding layer 210 may be composed of the nanofibers 211. The nanofibers 211 forming the nanofiber layer 212 may be formed of various kinds of materials. For example, the nanofiber 211 may be formed of polyester or polyimide. The thickness of the nanofiber 211 may range from 1 μm to 20 μm. If necessary, forming the nanofiber layer 212 with the nanofibers 211 of any other thickness is also possible. The nanofiber 211 may be plated with metal so that the nanofiber layer 212 has electrical conductivity. The thickness of the nanofiber layer 212 may range from 10 μm to 20 μm. For example, the thickness of the nanofiber layer 212 may be 15 μm. In such a thickness range of the nanofiber layer 212, the density of the nanofibers 211 constituting the nanofiber layer 212 may range from 0.8 $g/cm^3$ to 0.9 $g/cm^3$.

As described above, in order to give electrical conductivity to the nanofiber layer 212, a metal plating treatment may be performed on the nanofiber 211. When the density of the nanofibers 211 is less than 0.8 $g/cm^3$, the nanofiber layer 212 may not have sufficient electrical conductivity for noise shielding. When the density of the nanofibers 211 exceeds 0.9 $g/cm^3$, the metal plating may not be sufficiently performed up to the nanofibers 211 placed inside the nanofiber layer 212. In this case, current may not sufficiently flow in a thickness direction (i.e., a vertical direction denoted by 'Y' in FIG. 4) of the nanofiber layer 212 which is perpendicular to a lengthwise direction (i.e., a horizontal direction denoted by 'X' in FIG. 4). If the current does not flow properly in the vertical direction of the nanofiber layer 212, the nanofiber layer 212 may be substantially separated into two or more conductive layers. As will be described later, the noise shielding performance is closely related to the resistance of a contact portion. If the nanofiber layer 212 is separated into two or more conductive layers, the number of contact portions increases, and thus the resistance of the contact portions increases. This may often cause a reduction in the noise shielding performance. In some cases, noise resonance may occur between two or more separated conductive layers, thereby causing noise amplification. Therefore, it may be desirable that the density of the nanofibers 211 ranges from 0.8 $g/cm^3$ to 0.9 $g/cm^3$. The nanofiber layer 212 formed of the nanofibers 211 plated within this density range may have electrical conductivity required to shield noise. In addition, because the current flows smoothly in the vertical direction, the nanofiber layer 212 may be prevented from being separated into two or more conductive layers. For example, the density of the nanofibers 211 may be 0.86 $g/cm^3$.

The nanofiber 211 has flexibility, and thus the nanofiber layer 212 formed of the flexible nanofibers 211 has a high elastic modulus. So, the shielding layer 210 including the nanofiber layer 212 can be effectively disposed in a curved portion. In addition, even if stress occurs by an external force applied to the shielding layer 210, resultant strain is low. Therefore, the shielding layer 210 may maintain a state in contact with a ground portion (e.g., a ground portion 520 in FIG. 5B), and there is no fear of cracking inside. Accordingly, the shielding layer 210 including the nanofibers 211 can maintain required shielding performance for a long time. For example, the shielding layer 210 including the nanofiber layer 212 formed of the nanofibers 211 can have a very high reliability.

The nanofiber layer 212 may be coated with an adhesive material 217 to have adhesiveness. According to various embodiments of the disclosure, the adhesive material 217 may be a liquid material or a solid material (e.g., powder, flake), and may be adhered by drying, pressure, contact, chemical reaction, or heat.

The metal particles 215 and the graphite particles 213 may be disposed in the nanofiber layer 212 to fill an empty space formed between the nanofibers 211. When the metal particles 215 and the graphite particles 213 are blended with an adhesive material and then the nanofiber layer 212 is coated with the adhesive material, the metal particles 215 and the graphite particles 213 may be disposed on portions of the nanofiber layer 212 coated with the adhesive material between the nanofibers 211. The metal particles 215 may be particles formed of a highly conductive metal, such as nickel, aluminum, or copper. The graphite particles 213 may be particles larger in size than the metal particles 215. The volume occupied by the graphite particles 213 in the nanofiber layer 212 may be greater than the volume occupied by the metal particles 215 in the nanofiber layer 212. As such, when the metal particles 215 and the graphite particles 213 fill the empty space formed between the nanofibers 211, the electrical conductivity of the nanofiber layer 212 may be improved. For example, the current flow in the vertical direction of the nanofiber layer 212 may be smooth.

The insulating layer 220 may electrically isolate a portion covered with the shielding member from the other portion. For this, the insulating layer 220 may be formed of a material having a low electrical conductivity. For example, the insulating layer 220 may be formed of a dielectric material. The insulating layer 220 may be formed in the form of a laminated film. The insulating layer 220 may include a first insulating layer 221 and a second insulating layer 222.

Referring to FIGS. 3 and 4, the first insulating layer 221 may be stacked on (i.e., disposed above) the upper surface of the shielding layer 210. The second insulating layer 222 may be stacked on (i.e., disposed under) the lower surface of the shielding layer 210. The first and second insulating layers 221 and 222 may be different from each other in thickness. For example, the thickness of the first insulating layer 221 may be 10 μm, and the thickness of the second insulating layer 222 may be 50 μm. If necessary, the thicknesses of the first and second insulating layers 221 and 222 may be variously changed.

Referring to FIG. 3, portions 221a and 221b of the first and second insulating layers 221 and 222 may be removed. For example, in order to allow the shielding layer 210 to be directly in contact with a ground portion (e.g., a ground portion 520 in FIGS. 5A and 5B) of a printed circuit board (PCB) (e.g., a PCB 510 in FIGS. 5A and 5B), the second insulating layer 222 stacked on the lower surface of the shielding layer 210 may be removed in part at a portion 222b corresponding to the ground portion. Additionally, in order to allow the shielding layer 210 to be directly in contact with a processor (e.g., a processor 530 in FIGS. 5A and 5B) of the PCB, the second insulating layer 222 may be removed in part at the portion 222a corresponding to the processor. In addition, the first insulating layer 221 stacked on the upper surface of the shielding layer 210 may be removed in part at the portion 221a corresponding to the removed portion 222a of the second insulating layer 222. In the removed portions 221a and 222a of the first and second insulating layers 221 and 222, a thermal interface material (TIM) 250 may be disposed. The TIM 250 may be formed of a material capable of effectively transferring heat. Therefore, heat generated in the processor may be directly transferred to a heat diffusion member (e.g., a heat diffusion member 590 in FIG. 5B) along the TIM 250 and the shielding layer 210. This heat transfer will be described later.

The absorbing layer 230 may absorb noise generated from adjacent electronic components. The absorbing layer 230 may be formed of various kinds of materials, such as a conductor, a dielectric material, or a magnetic material, capable of absorbing electromagnetic waves. According to various embodiments of the disclosure, the absorbing layer 230 may be disposed on the upper surface of the second insulating layer 222. If necessary, the arrangement of the absorbing layer 230 may be variously changed. As shown in FIG. 3, the absorbing layer 230 may be divided into a plurality of segments disposed respectively on the second insulating layer 222. If the absorbing layer 230 is not divided, noises in the form of electromagnetic waves generated from the respective electronic components may move along the absorbing layer 230 and affect each other. In addition, the noise generated from each electronic component may affect other electronic components through the absorbing layer 230. When the absorbing layer 230 is divided into a plurality of segments, electromagnetic waves may flow only within a corresponding segment of the divided absorbing layer 230. This can prevent the above phenomenon, and thus noise can be absorbed and removed more effectively.

According to various embodiments of the disclosure, the absorbing layer 230 may be, for example, an electromagnetic absorber sheet, and may be formed of a stack of flaked magnetic materials. According to various embodiments of the disclosure, the absorbing layer 230 may be configured to absorb frequencies in a band of 10 MHz to 10 GHz.

In some cases, the plurality of segments of the absorbing layer 230 may be configured to be different from each other in magnetic permeability. When the absorbing layer 230 is formed of a magnetic material, an optimal noise frequency absorbed by the absorbing layer 230 may vary according to magnetic permeability. Considering that the electronic components mounted on the PCB may generate noise of different frequencies, it may be desirable that the absorbing layer 230 is composed of plural segments each having suitable magnetic permeability for effectively absorbing the frequency of noise generated in each electronic component. For example, the absorbing layer 230 having plural segments being different from each other in magnetic permeability can more effectively absorb the noise in various bands generated from the respective electronic components.

FIG. 5A is a plan view of a printed circuit board of an electronic device, to which a shielding member is applied, according to an embodiment of the disclosure.

Figure 5B:
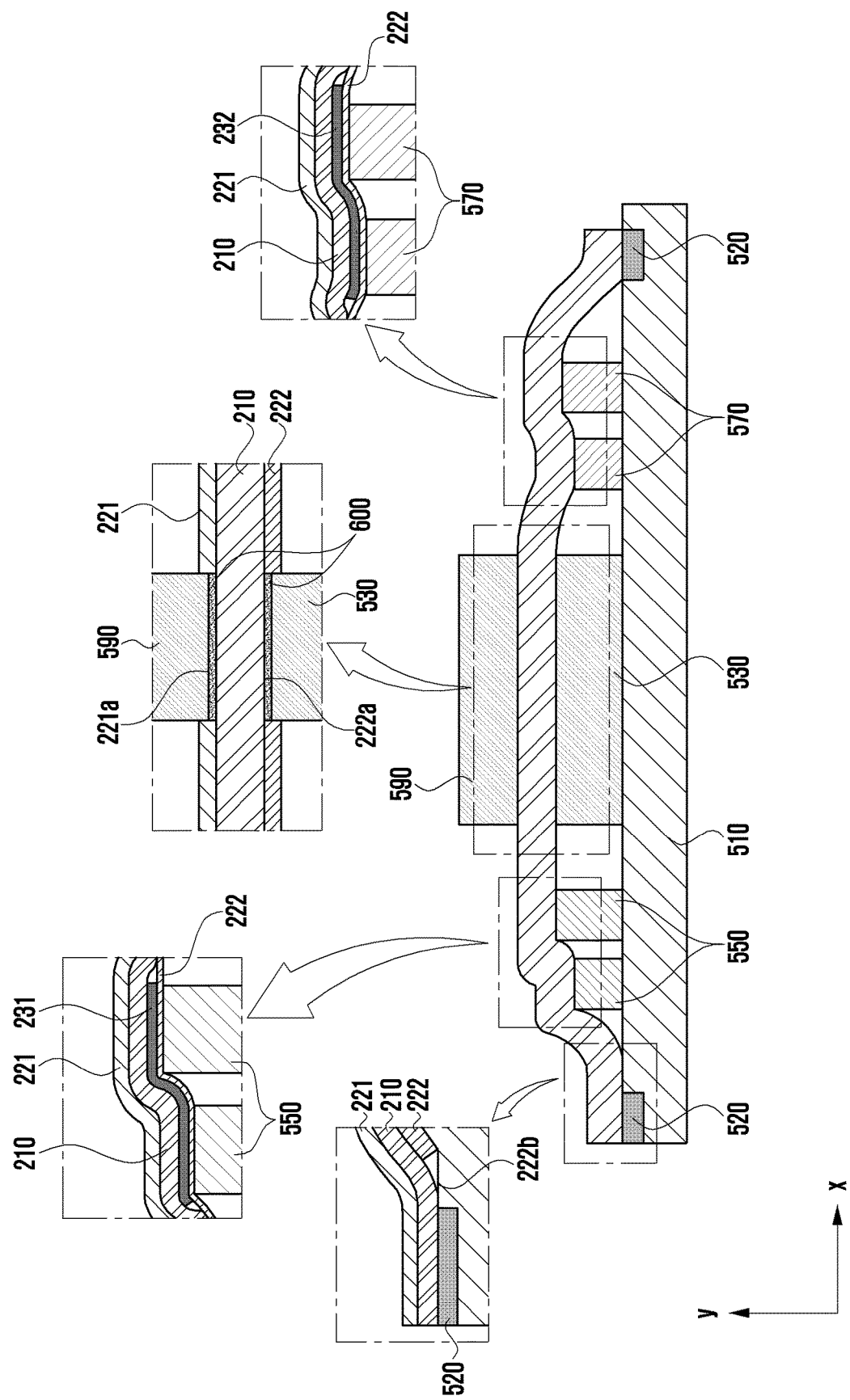
FIG. 5B is a cross-sectional view of an electronic device, to which a shielding member is applied, according to an embodiment of the disclosure.

FIG. 5B is a cross-sectional view of an electronic device, to which a shielding member is applied, according to an embodiment of the disclosure.

Figure 6:
FIG. 6 is a graph showing a relation between a contact resistance and a shielding performance according to an embodiment of the disclosure.

FIG. 6 is a graph showing a relation between a contact resistance and a shielding performance according to an embodiment of the disclosure.

Referring to FIG. 5A, the shielding member may be disposed to cover various electronic components (e.g., a processor 530 and other electronic components 550 and 570) mounted on a printed circuit board (PCB) 510.

Referring to FIG. 5B, the second insulating layer 222 stacked on the lower surface of the shielding layer 210 may be removed in part at a portion being in contact with a ground portion 520. Thus, the ground portion 520 and the shielding layer 210 may be directly in contact with each other.

Referring to FIG. 6, the contact resistance with the ground portion 520 is closely related to the shielding performance.

The lower the contact resistance, the better the shielding performance. This is because the lower the contact resistance, the smoother the noise flowing along the shielding member can be moved to the ground portion 520. Through this, the shielding member can effectively shield the noise generated from electronic components covered by the shielding member.

As described above, a shielding member of the related art is composed of a conductive layer formed of metal and a conductive adhesive layer. A contact portion may be formed between the ground portion and the conductive adhesive layer and between the conductive adhesive layer and the conductive layer. In this structure of the shielding member of the related art, the contact resistance is increased on the whole, and also there is difficulty in controlling the contact resistance. For this reason, the shielding member of the related art has drawbacks of having low shielding performance and low stability.

In this disclosure, a contact portion refers to a member or region that is in electrical contact with the ground portion 520.

In the shielding member according to various embodiments of the disclosure, the one and only contact portion that is in electrical contact with the ground portion 520 is the shielding layer 210. For example, the only contact resistance between the ground portion 520 and the shielding member is measured at the contact portion between the shielding layer 210 and the ground portion 520. Therefore, the shielding member according to various embodiments of the disclosure has lower contact resistance and better shielding performance than the shielding member of the related art. In addition, because there is the only one contact portion, the contact resistance can be easily controlled.

The shielding layer 210 of the shielding member may be composed of the nanofiber layer 212 including the nanofibers 211. As described above, because the nanofiber layer 212 has a high elastic modulus, the degree of deformation due to an external force is low. For example, even if an external force acts on the shielding member due to various impacts applied to the electronic device, the shielding member including the nanofiber layer 212 having a high elastic modulus can maintain required shielding performance. For example, a contact state between the shielding layer 210 and the ground portion 520 can be maintained reliably. Further, using such a highly reliable shielding member can make it possible to reduce the area occupied by the ground portion 520 on the PCB 510. Reducing the area of the ground portion 520 may result in reducing the area of the PCB 510 itself or efficiently designing the arrangement of the electronic components on the PCB 510.

As described above, the second insulating layer 222 of the insulating layer 220 may be removed in part at the portion 222a being in contact with the processor 530. Thus, as shown in FIG. 5B, the shielding layer 210 may be directly in contact with the processor 530. In addition, the first insulating layer 221 may be removed in part at the portion 221a corresponding to the removed portion 222a of the second insulating layer 222. In this removed portion 221a, a heat diffusion member 590 may be directly in contact with the shielding layer 210 as shown in FIG. 5B. In many cases, the processor 530 may be a component generating the most heat among various electronic components mounted on the PCB 510. The shielding layer 210 that is directly in contact with the processor 530 and the heat diffusion member 590 may transfer heat generated by the processor 530 to the heat diffusion member 590. Meanwhile, a thermal interface material (TIM) 600 may be disposed between the shielding layer 210 and the processor 530 and between the shielding layer 210 and the heat diffusion member 590. The TIM 600 is a material with very high thermal conductivity. Heat can be effectively transferred through the TIM 600.

As mentioned above, the shielding member of the related art includes the conductive adhesive layer. However, the conductive adhesive layer has thermal insulation, so that heat cannot be effectively transferred. In contrast, the shielding layer 210 according to various embodiments of the disclosure can transfer heat of the processor 530 in a thickness direction (i.e., a vertical direction denoted by 'Y' in FIG. 5B) of the shielding layer 210 which is perpendicular to a lengthwise direction (i.e., a horizontal direction denoted by 'X' in FIG. 5B). Therefore, the shielding member according to various embodiments of the disclosure can effectively transfer heat generated from the electronic component to the heat diffusion member 590. The heat diffusion member 590 may be connected to a heat dissipation member (not shown), such as a fan to discharge heat generated by the processor 530 to the outside.

Referring to FIGS. 5A and 5B, various electronic components 550 and 570 as well as the processor 530 may be mounted on the PCB 510. These electronic components generate noise of different bands depending on signals being processed. For example, in FIGS. 5A and 5B, one electronic component 550 mounted near one side of the processor 530 and another electronic component 570 mounted near other side of the processor 530 may generate noise of different bands. In addition, as shown in FIG. 5A, the absorbing layer may be divided into a plurality of segments 231 and 232. One segment 231 of the absorbing layer that is in contact with one electronic component 550 may have a magnetic permeability to effectively absorb noise generated from that electronic component 550. Similarly, another segment 232 of the absorbing layer that is in contact with another electronic component 570 may have a magnetic permeability to effectively absorb noise generated from that electronic component 570. Thus, the segments 231 and 232 of the absorbing layer may be formed of materials having different magnetic permeability. As such, disposing the respective segments 231 and 232 of the absorbing layer 230, different from each other in magnetic permeability, may allow effectively absorbing noise of different bands generated from the respective electronic components 550 and 570 adjacent to the segments 231 and 232. In addition, dividing the absorbing layer 230 into the segments 231 and 232 may prevent the above-described phenomenon that noise flows along the absorbing layer 230.

According to various embodiments of the disclosure, a shielding member may comprise a shielding layer having flexibility, and an insulating layer stacked on the shielding layer. The shielding layer may include a nanofiber layer including nanofibers plated to have electrical conductivity and coated with an adhesive material, and conductive particles disposed in the nanofiber layer.

In addition, the conductive particles of the shielding layer may be disposed on portions, coated with the adhesive material, of the nanofiber layer of the shielding layer.

In addition, the conductive particles of the shielding layer may include at least one of metal particles and graphite particles.

In addition, the shielding layer may be in contact with a ground portion of a printed circuit board of an electronic device.

In addition, the insulating layer may include a first insulating layer stacked on an upper surface of the shielding layer, and a second insulating layer stacked on a lower surface of the shielding layer.

In addition, the shielding member may further comprise an absorbing layer absorbing noise.

In addition, the absorbing layer may be disposed on an upper surface of the second insulating layer of the insulating layer.

In addition, the absorbing layer may be divided into a plurality of segments disposed respectively on an upper surface of the second insulating layer.

In addition, the plurality of segments of the absorbing layer may be different from each other in magnetic permeability.

In addition, the conductive particles of the shielding layer may include metal particles and graphite particles, and a volume occupied by the graphite particles in the shielding layer may be greater than a volume occupied by the metal particles in the shielding layer.

In addition, the nanofiber layer of the shielding layer may have a thickness ranging from 10 μm to 20 μm.

In addition, nanofibers constituting the nanofiber layer of the shielding layer may have a density ranging from 0.8 g/cm$^3$ to 0.9 g/cm$^3$.

In addition, the nanofiber layer of the shielding layer may have a thickness of about 15 μm, and nanofibers constituting the nanofiber layer of the shielding layer may have a density of about 0.86 g/cm$^3$.

According to various embodiments of the disclosure, an electronic device may comprise a printed circuit board (PCB) on which various electronic components are mounted, a ground portion disposed on the PCB, and a shielding member disposed to cover the electronic components and the ground portion. The shielding member may include a shielding layer having nanofibers and corresponding to only one contact portion in electrical contact with the ground portion.

In addition, the shielding member may further include an insulating layer, and the insulating layer may include a first insulating layer stacked on an upper surface of the shielding layer, and a second insulating layer stacked on a lower surface of the shielding layer.

In addition, the second insulating layer of the insulating layer of the shielding member may be removed in part at a portion corresponding to a processor mounted on the PCB in order to allow the shielding layer to be in contact with the processor.

In addition, the first insulating layer of the insulating layer of the shielding member may be removed in part at a portion corresponding to the removed portion of the second insulating layer of the insulating layer, and a heat diffusion member may be in contact with the shielding layer in the removed portion of the first insulating layer of the insulating layer.

In addition, the shielding member may further include an absorbing layer disposed on an upper surface of the second insulating layer of the insulating layer to absorb noise.

In addition, the absorbing layer may be divided into a plurality of segments disposed respectively on the upper surface of the second insulating layer so as to be in contact with different electronic components mounted on the PCB.

In addition, the plurality of segments of the absorbing layer may be different from each other in magnetic permeability.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A shielding member comprising:
    a flexible shielding layer configured to shield electromagnetic interference (EMI);
    an electrically insulating layer stacked on the flexible shielding layer; and
    an absorbing layer configured to absorb noise in a form of electromagnetic waves,
    wherein the flexible shielding layer includes:
        a nanofiber layer including electrically conductive nanofibers which are coated with an adhesive material, and
        electrically conductive solid particles disposed in the nanofiber layer, and
    wherein the absorbing layer is divided into a plurality of segments disposed respectively on the insulating layer such that the electromagnetic waves flow only within corresponding segments, the plurality of segments varying in magnetic permeability such that each segment has a magnetic permeability for effectively absorbing a frequency of noise generated in an electronic component.

2. The shielding member of claim 1, wherein the electrically conductive solid particles are disposed on portions, coated with the adhesive material, of the nanofiber layer.

3. The shielding member of claim 1, wherein the electrically conductive solid particles include at least one of metal particles or graphite particles.

4. The shielding member of claim 1, wherein the flexible shielding layer is in contact with a ground portion of a printed circuit board of an electronic device.

5. The shielding member of claim 1,
    wherein the insulating layer includes a first insulating layer stacked on an upper surface of the flexible shielding layer, and
    wherein the insulating layer includes a second insulating layer stacked on a lower surface of the flexible shielding layer.

6. The shielding member of claim 1,
    wherein the electrically conductive solid particles include metal particles and graphite particles, and
    wherein a volume occupied by the graphite particles in the flexible shielding layer is greater than a volume occupied by the metal particles in the flexible shielding layer.

7. The shielding member of claim 1, wherein the nanofiber layer of the flexible shielding layer has a thickness ranging from 10 μm to 20 μm.

8. The shielding member of claim 1, wherein the nanofibers constituting the nanofiber layer of the flexible shielding layer have a density ranging from 0.8 g/cm$^3$ to 0.9 g/cm$^3$.

9. The shielding member of claim 1,
    wherein the nanofiber layer has a thickness of about 15 μm, and
    wherein the nanofibers constituting the nanofiber layer have a density of about 0.86 g/cm$^3$.

10. The shielding member of claim 5, wherein the absorbing layer is disposed on an upper surface of the second insulating layer.

11. An electronic device comprising:
    a printed circuit board (PCB) on which electronic components are mounted;
    a ground portion disposed on the PCB; and a shielding member disposed to cover the electronic components and the ground portion, wherein the shielding member includes a shielding layer having conductive nanofibers and corresponding to only one contact portion in electrical contact with the ground portion, wherein the shielding member further includes an insulating layer, and wherein the shielding member further includes an absorbing layer divided into a plurality of segments disposed respectively on the insulating layer so as to correspond to different electronic components mounted on the PCB.

12. The electronic device of claim 11,
wherein the insulating layer includes:
   a first insulating layer stacked on an upper surface of the shielding layer, and
   a second insulating layer stacked on a lower surface of the shielding layer.

13. The electronic device of claim 11, wherein the plurality of segments of the absorbing layer vary from each other in magnetic permeability.

14. The electronic device of claim 12, wherein the second insulating layer of the insulating layer of the shielding member is removed in part at a portion corresponding to a processor mounted on the PCB in order to allow the shielding layer to be in contact with the processor.

15. The electronic device of claim 12, wherein the absorbing layer is disposed on an upper surface of the second insulating layer.

16. The electronic device of claim 14,
wherein the first insulating layer of the insulating layer of the shielding member is removed in part at a portion corresponding to the removed portion of the second insulating layer of the insulating layer, and
wherein a heat diffusion member is in contact with the shielding layer in the removed portion of the first insulating layer of the insulating layer.

* * * * *